(12) United States Patent
Ryu

(10) Patent No.: US 8,122,599 B2
(45) Date of Patent: Feb. 28, 2012

(54) METHOD OF MANUFACTURING A PRINTED CIRCUIT BOARD (PCB)

(75) Inventor: Jae-Chul Ryu, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 633 days.

(21) Appl. No.: 12/288,740

(22) Filed: Oct. 23, 2008

(65) Prior Publication Data

US 2009/0107699 A1 Apr. 30, 2009

(30) Foreign Application Priority Data

Oct. 26, 2007 (KR) .................. 10-2007-0108407

(51) Int. Cl.
*H05K 3/02* (2006.01)
*H05K 1/00* (2006.01)

(52) U.S. Cl. ............... 29/846; 29/825; 29/827; 29/832; 29/852; 29/879; 174/250

(58) Field of Classification Search ............ 29/825, 29/827, 832, 846, 852, 879; 174/36, 355, 174/356, 250; 361/502, 524, 532, 509
See application file for complete search history.

(56) References Cited

U.S. PATENT DOCUMENTS 3,205,555 A * 9/1965 Balde et al. ............ 29/25.42
4,897,508 A * 1/1990 Mahulikar et al. ............ 174/522
5,025,114 A * 6/1991 Braden .................... 174/530
5,545,850 A * 8/1996 Mahulikar et al. ............ 174/529
2005/0241954 A1 11/2005 Iwanami

FOREIGN PATENT DOCUMENTS

| CN | 1694603 A | 11/2005 |
| JP | 02-164093 A | 6/1990 |
| JP | 11-220245 A | 8/1999 |
| JP | 2003-013281 A | 1/2003 |

OTHER PUBLICATIONS

Office Action established for CN200810166763.8.

* cited by examiner

*Primary Examiner* — Derris Banks
*Assistant Examiner* — Tai Nguyen
(74) *Attorney, Agent, or Firm* — Drinker Biddle & Reath LLP

(57) ABSTRACT

A printed circuit board (PCB) and appertaining method of manufacturing are provided. The method includes: coating a metal layer on the entire surface of a substrate having an outer surface on which an interconnection pattern is formed; partially removing the metal layer from the surface of the substrate to form a window for a chip to be mounted therein and partially exposing the interconnection pattern to form a bonding finger; forming a first insulating layer on the metal layer by primarily anodizing the metal layer; electroplating a surface of the bonding finger by supplying power to the metal layer; and forming a second insulating layer disposed below the first insulating layer by entirely and secondarily anodizing the metal layer. A gold electroplating process can be performed without a lead wire, and an oxide layer formed by an anodizing process can protect circuits formed on the substrate and electrically insulate them.

7 Claims, 7 Drawing Sheets

METHOD OF MANUFACTURING A PRINTED CIRCUIT BOARD (PCB)

CROSS-REFERENCE TO RELATED APPLICATIONS

This application claims the benefit of Korean Patent Application No. 10-2007-0108407, filed Oct. 26, 2007, the contents of which are hereby incorporated herein by reference in their entirety.

BACKGROUND

The present invention relates to a method of manufacturing a printed circuit board (PCB) and a PCB manufactured by the same, and more particularly, to a method of manufacturing a PCB in which an oxide layer for protecting a circuit pattern formed on a substrate is formed using an anodizing process, and a PCB manufactured by the method.

In recent years, as electronic appliances are scaled down and their functions are more complex, multi-chip packages (MCPs) or stacked chip scale packages in which integrated circuit (IC) chips are stacked are being widely employed. An IC package substrate used for the MCP or the stacked chip scale package must have a predetermined thickness or less so that the MCP or the stacked chip scale package can be applied to small-sized electronic appliances with complex functions.

A conventional method of manufacturing a printed circuit board (PCB) necessarily includes a process of coating solder resist in order to prevent oxidation of an exposed circuit pattern (or interconnection pattern) on an outer surface of a substrate and electrically insulate circuit patterns from one another. The solder resist is a kind of paint and is obtained by corroding copper foil coated on the substrate. Basically, the solder resist is a bare wire that is not coated with an insulating material.

FIG. 1 is a block diagram of a conventional gold electroplating process using a lead wire, and FIGS. 2A through 2C are diagrams illustrating a conventional method of manufacturing a PCB using a gold electroplating process.

Referring to FIGS. 1, and 2A through 2C, in step S10, an interconnection pattern 2 and a lead wire pattern 3 are formed on a surface of a substrate 1, and a solder resist 4 formed of an insulating material is coated on the entire surface of the substrate 1.

Thereafter, in step S20, a dry process, an exposure process, and a developing process are performed, thereby forming a window 5 in which a chip (not shown) is mounted on a predetermined portion of the substrate 1 so that a bonding finger 2a is exposed on the substrate 1.

Subsequently, in step S30, a power source 6 is connected to the lead wire pattern 3 and the bonding finger 2a is electroplated with gold 2a' in order to improve bonding efficiency.

However, since it is necessary to form a gold-plating lead wire in order to electroplate the bonding finger 2a with gold, manufacturing the conventional PCB is complicated and costly.

Also, the conventional solder resist has a high moisture absorption rate and a high coefficient of thermal expansion, so that the conventional PCB cannot ensure high reliability.

Furthermore, when the substrate 1 has a very small thickness, a stiffened plate must be further adhered to the substrate 1, and thus moving or handling the PCB at an interval between process steps during a package assembly process is difficult.

SUMMARY

An exemplary embodiment of the invention provides a method of manufacturing a printed circuit board (PCB), in which a bonding finger is electroplated with gold by a primary anodizing process and an insulating layer is formed on the surface of a substrate by a secondary anodizing process so that a gold electroplating process can be performed without a lead wire, and a PCB manufactured by the method.

Another exemplary embodiment of the invention provides a method of manufacturing a PCB, in which an oxide layer formed by anodization can effectively protect a circuit pattern formed on a substrate and electrically insulate circuits from one another to enhance reliability, and a PCB manufactured by the method.

Yet another exemplary embodiment of the invention provides a method of manufacturing a PCB, in which the surface of a substrate is coated with ceramic so that the substrate can maintain stiffness to make it unnecessary to adhere a stiffened plate to the substrate with a small thickness, and thus moving or handing the PCB at an interval between process steps during a package assembly process is very easy, and a PCB manufactured by the same.

In one aspect, the present invention is directed to a method of manufacturing a PCB. The method includes: coating a metal layer on the entire surface of a substrate having an outer surface on which an interconnection pattern is formed; partially removing the metal layer from the surface of the substrate to form a window for a chip to be mounted therein and partially exposing the interconnection pattern to form a bonding finger; forming a first insulating layer on the metal layer by primarily anodizing the metal layer; electroplating a surface of the bonding finger by supplying power to the metal layer; and forming a second insulating layer disposed below the first insulating layer by entirely and secondarily anodizing the metal layer.

According to various embodiments of the present invention, when the bonding finger is electroplated, the interconnection pattern may not include a plating lead wire.

The metal layer may be formed of any one of Al, Mg, Zn, Ti, Ta, Hf, and Nb.

Partially exposing the interconnection pattern may be performed by an exposure process, a developing process, and an etching process.

Electroplating of the surface of the bonding finger may be performed by a gold electroplating process. Here, the first and second insulating layers may be oxide layers.

In another aspect, the present invention is directed to a PCB. The PCB includes: an interconnection pattern disposed on an outer surface of a substrate. A bonding finger formed by partially exposing the interconnection pattern on the surface of the substrate is electroplated with gold. An unexposed portion of the interconnection pattern is coated with an oxide layer.

The oxide layer may be an aluminum oxide (Al2O3) layer.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE PREFERRED EMBODIMENTS

Figure 1:
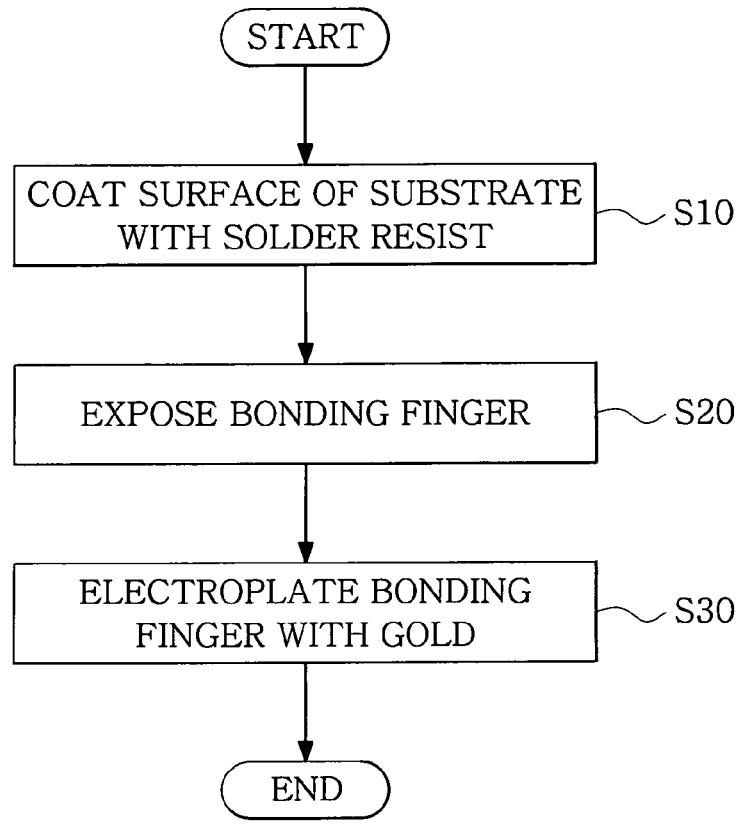
FIG. 1 is a block diagram of a conventional gold electroplating process using a lead wire.
Figure 2A:
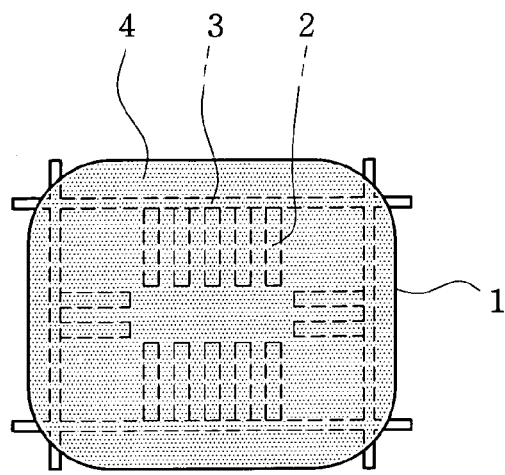
FIGS. 2A-2C are diagrams illustrating a conventional method of manufacturing a printed circuit board (PCB) using a gold electroplating process.
Figure 2B:
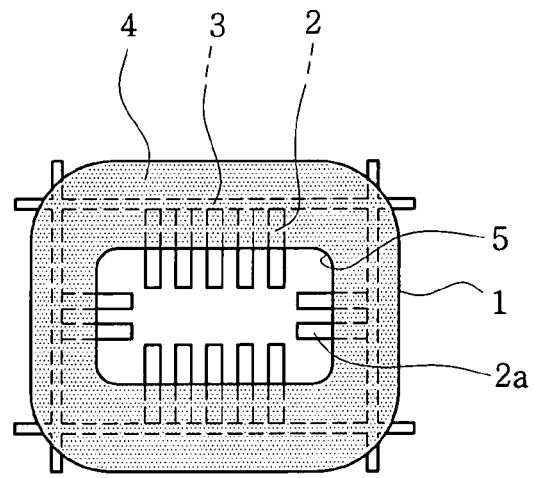
Figure 2C:
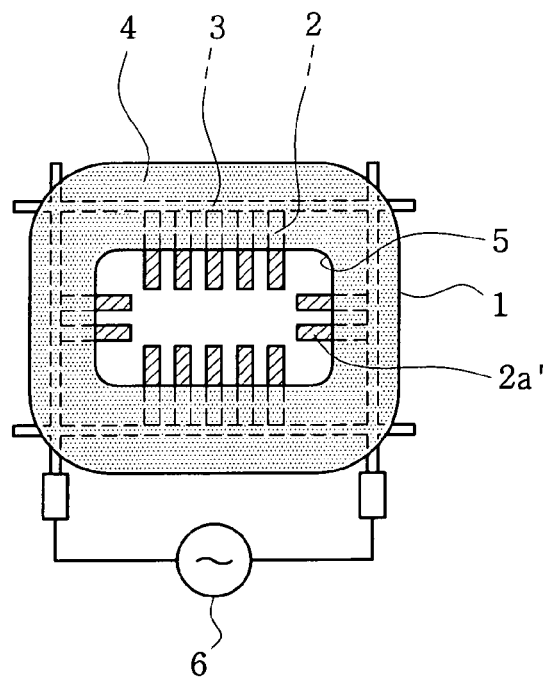

Various embodiments of the present invention will now be described more fully hereinafter with reference to the accompanying drawings, in which exemplary embodiments of the invention are shown. In the drawings, the thicknesses of layers and regions may be exaggerated for clarity. It will also be understood that when a layer is referred to as being "on" another layer or substrate, it can be directly on the other layer or substrate or intervening layers may also be present. Like reference numerals refer to like elements throughout the specification.

Figure 3:
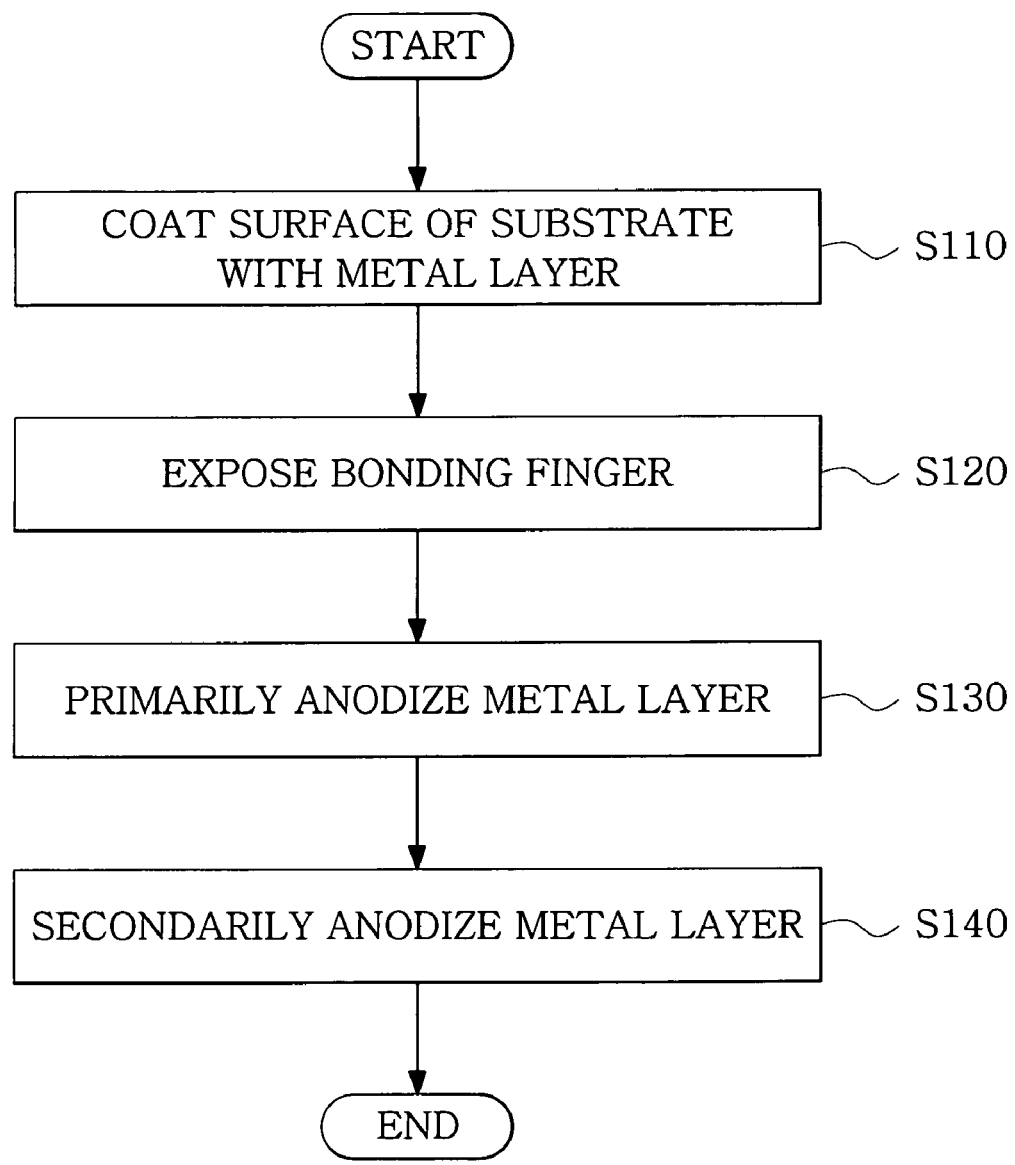
FIG. 3 is a flowchart illustrating a method of manufacturing a PCB according to an embodiment of the present invention.
Figure 4A:
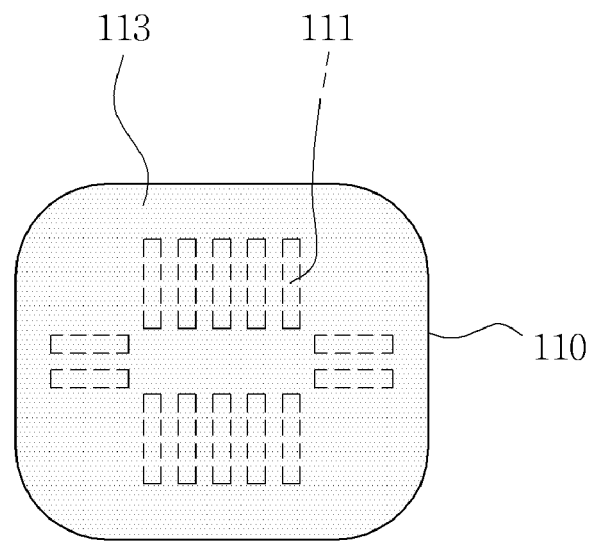
FIGS. 4A-4D are diagrams illustrating a method of manufacturing a PCB according to an embodiment of the present invention.
Figure 4B:
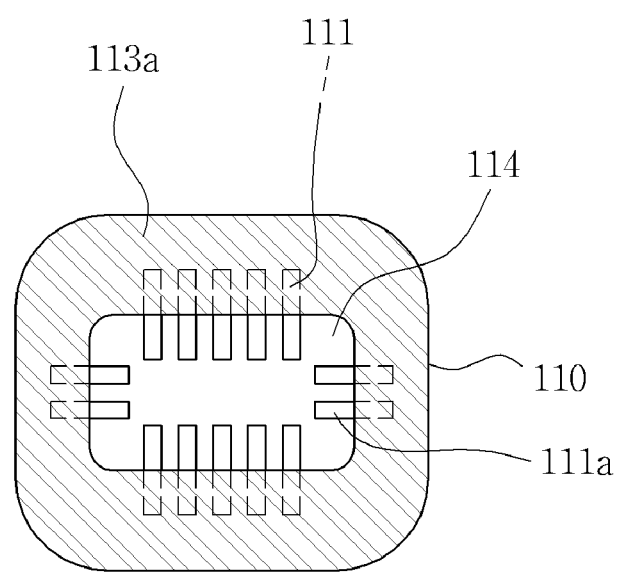
Figure 4C:
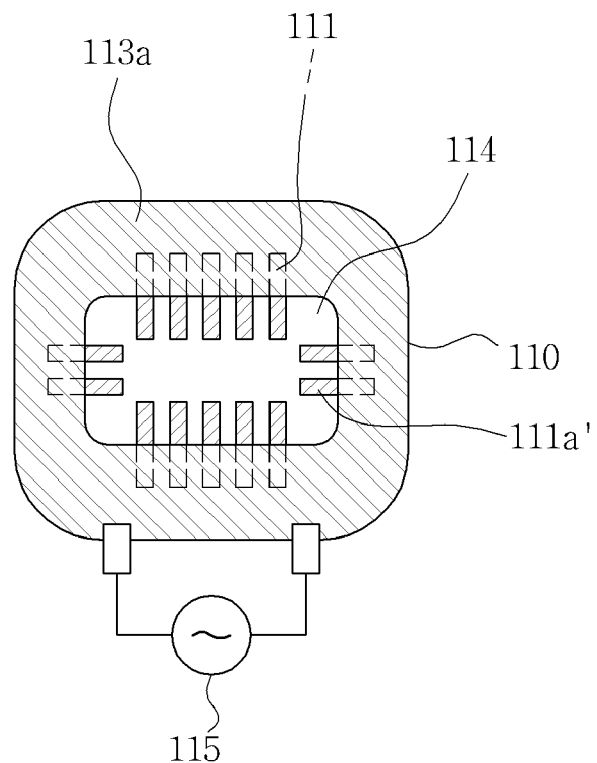
Figure 4D:
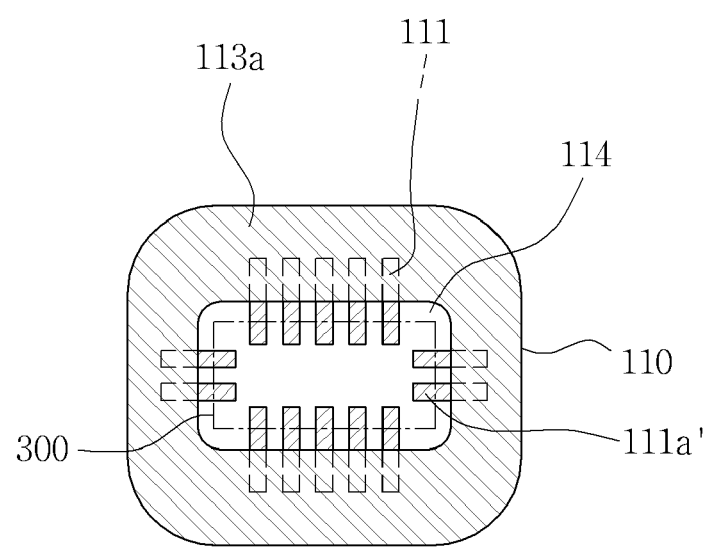

FIG. 3 is a flowchart illustrating a method of manufacturing a PCB according to various embodiments of the present invention, and FIGS. 4A through 4D are diagrams illustrating a method of manufacturing a PCB according to various embodiments of the present invention.

Referring to FIGS. 3, and 4A through 4D, a method of manufacturing a PCB according to various embodiments of the present invention includes coating a metal layer 113 on the entire surface of a substrate 110 having an outer surface on which an interconnection pattern 111 is formed (step S110). In step S120, the metal layer 113 is partially removed from the surface of the substrate 110 to form a window 114 for a chip 300 to be mounted therein and partially expose the interconnection pattern 111 on the surface of the substrate 110 to form a bonding finger 111a. In step S130, the metal layer 113 is primarily anodized to form an insulating layer 113a on a surface of the metal layer 113. In step S140, a surface of the bonding finger 111a is electroplated with gold 111a' by supplying power 115 to the metal layer 113. In step S150, the metal layer 113 is secondarily anodized so that the entire metal layer 113 (i.e., both the surface and inside of the metal layer 113) is formed of an insulating material or oxide.

Only the surface of the metal layer 113 is oxidized during the primary anodizing process, while not only the surface of the metal layer 113 but also the inside thereof are oxidized during the secondary anodizing process.

During the primary anodizing process, only the surface of the metal layer 113 is oxidized so that the metal layer 113 can be electrically connected to the interconnection pattern 111 formed of copper foil and the bonding finger 111a of the interconnection pattern 111 can be electroplated with gold 111a'.

The metal layer 113 may be coated by a sputtering process or an evaporation process.

In step S120, exposing the bonding finger 111a of the interconnection pattern 111 to be electroplated with gold 111a' may be performed by an exposure process, a developing process and an etching process, and the etching process may be performed using a material used for etching aluminum, for example, sodium hydroxide or a mixture of nitric acid, phosphoric acid, and acetic acid.

In the method of manufacturing a PCB according to various embodiments of the present invention, when the bonding finger 111a is electroplated with gold 111a', the interconnection pattern 111 does not include a plating lead wire. In other words, since electroplating with gold 111a' is performed without a lead wire, the lead wire is not prepared during formation of the interconnection pattern 111.

In step S140, electroplating of the surface of the bonding finger 111a may be performed by electroplating with gold 111a'. Here, the bonding finger 111a refers to a portion of the interconnection pattern 111, which is electrically connected to a bonding pad of the chip 300.

Also, when the metal layer 112 is secondarily anodized, the metal layer 112 is entirely oxidized.

During anode-oxidization (or anodization), a metal layer provided as an anode is electrolyzed in a diluted acid solution so that the metal layer reacts with oxygen generated by the anode to thereby form a metal oxide layer having good adhesive characteristics with a base metal.

Typically, an anodizing process may be performed on an aluminum (Al) layer. However, magnesium (Mg), zinc (Zn), titanium (Ti), tantalum (Ta), hafnium (Hf), or niobium (Nb) may be anodized.

When an Al layer is electrolyzed at an anode, half the thickness of a surface of the Al layer is corroded, and the other half has aluminum oxide (Al2O3). In this case, the properties of the Al2O3 layer may depend on process conditions of the anodizing process, specifically, the composition and concentration of a solution, the type of an additive, the temperature of the solution, voltage, and current. The anodizing process results in formation of an oxide coating layer with a high corrosion resistance. Also, the PCB can be improved in appearance since the anodizing process produces a decorative effect.

Embodiment 1

FIGS. 5A through 5F are diagrams illustrating a method of manufacturing a PCB according to an exemplary embodiment of the present invention.

Figure 5A:
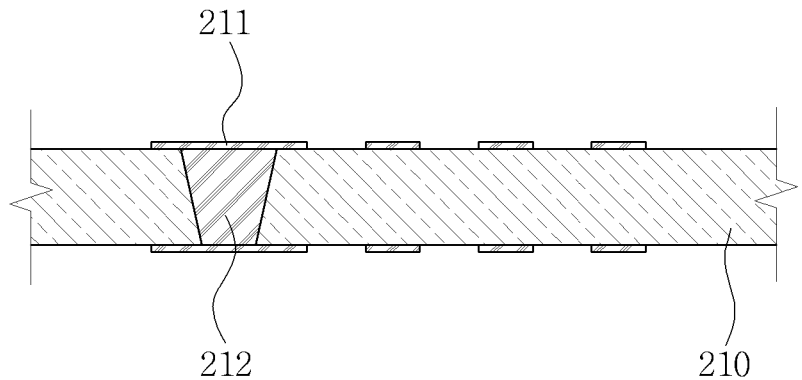
FIGS. 5A-5F are diagrams illustrating a method of manufacturing a PCB according to an exemplary embodiment of the present invention.

Referring to FIG. 5A, interconnection patterns 211, for example, copper patterns, are formed on both surfaces of a substrate 210 and electrically connected to each other by a via 212.

Figure 5B:
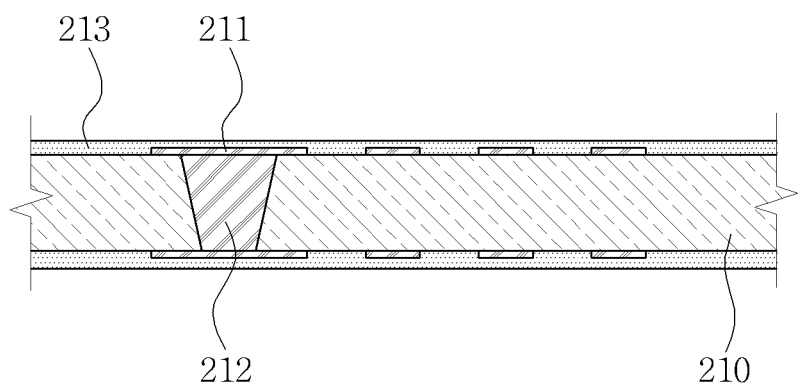

Referring to FIG. 5B, a metal layer 213, for example, an Al layer 213, is coated on the entire surface of the substrate 210. In this case, the metal layer 213 may be coated to a thickness of several $\mu$m by a sputtering process or an evaporation process. More specifically, the metal layer 213 may be formed to such a thickness so as not to allow resistance to exceed about 0.3 M$\Omega$, and thus the flow of current may not be impeded during a subsequent process.

Figure 5C:
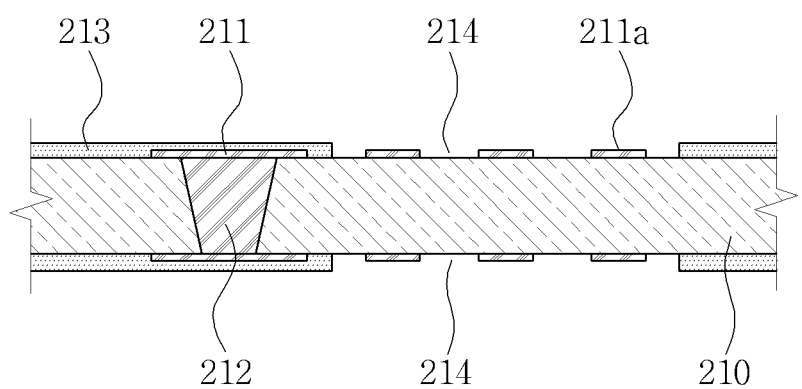

Referring to FIG. 5C, exposure, developing, and etching processes are performed so that the metal layer 213 is partially removed from a surface of the substrate 210 to form a window 214 for a chip 400 to be mounted therein. Thus, the window 214 is formed to partially expose the interconnection pattern 211 to form a bonding finger 211a.

Figure 5D:
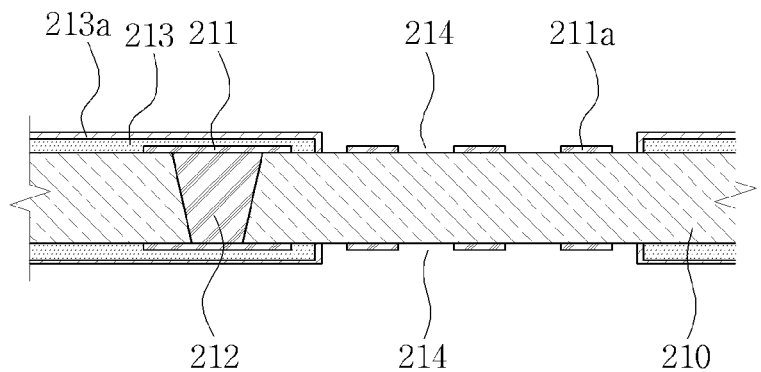

Referring to FIG. 5D, the metal layer 213 is primarily anodized so that an oxide layer 213a is formed only on the metal layer 213.

Figure 5E:
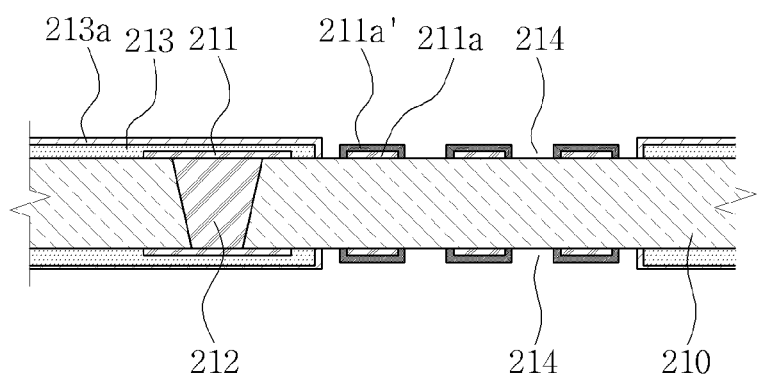

Referring to FIG. 5E, a current is supplied to the metal layer 213 so that a surface of the bonding finger 211a is electroplated with gold 211a'. Since the oxide layer 213a is formed only on the metal layer 213, the bonding finger 211a, but not the metal layer 213, is electroplated with gold 211a'.

Figure 5F:
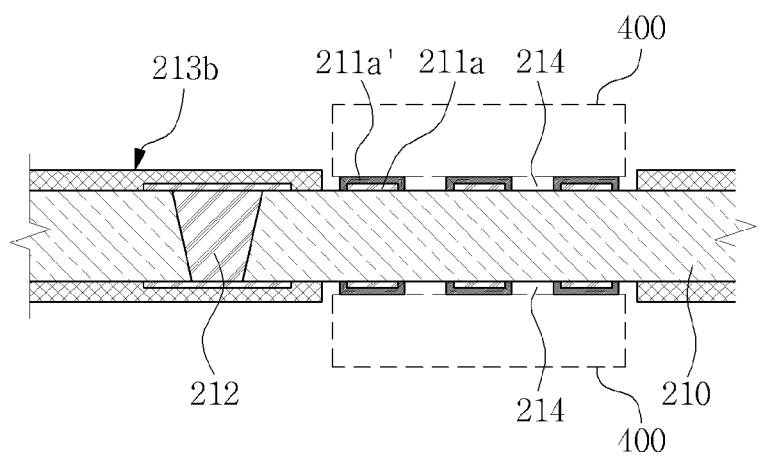

Referring to FIG. 5F, in order to prevent oxidation of the interconnection pattern 211, the metal layer 213 is secondarily anodized so that the metal layer 213 is entirely oxidized to form a metal oxide layer 213b, for example, an aluminum oxide ($Al_2O_3$) layer, which functions as a solder resist.

As shown in FIG. 5F, a PCB according to an embodiment of the present invention, which is manufactured by the above-described method, includes the interconnection pattern 211 coated on an outer surface of the substrate 210, the bonding finger 211a of the interconnection pattern 211, which is exposed on the surface of the substrate 210 and electroplated with gold 211a', and the metal oxide layer 213b coated on an unexposed portion of the interconnection pattern 211.

According to the embodiments of the present invention as described above, a gold electroplating process can be performed without a lead wire, and an oxide layer formed by an anodizing process can protect a circuit pattern formed on a substrate and electrically insulate circuits from one another. Also, since a PCB according to various embodiments of the present invention described above has a lower moisture absorption rate and a lower coefficient of thermal expansion than a conventional solder resist, the PCB can be highly reliable.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of components configured to perform the specified functions. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional aspects may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The word mechanism is intended to be used generally and is not limited solely to mechanical embodiments. Numerous modifications and adaptations will be readily apparent to those skilled in this art without departing from the spirit and scope of the present invention.

What is claimed is:

1. A method of manufacturing a printed circuit board (PCB), comprising:
   coating a metal layer on an entire surface of a substrate having an outer surface on which an interconnection pattern is formed;
   partially removing the metal layer from the surface of the substrate to form a window for a chip to be mounted therein and partially exposing the interconnection pattern to form a bonding finger;
   forming a first insulating layer on the metal layer by primarily anodizing the metal layer;
   electroplating a surface of the bonding finger by supplying power to the metal layer; and
   forming a second insulating layer disposed below the first insulating layer by entirely and secondarily anodizing the metal layer.

2. The method according to claim 1, wherein the interconnection pattern does not comprise a plating lead wire.

3. The method according to claim 1, wherein the metal layer is formed of one selected from the group consisting of Al, Mg, Zn, Ti, Ta, Hf, and Nb.

4. The method according to claim 1, wherein partially exposing the interconnection pattern is performed by an exposure process, a developing process, and an etching process.

5. The method according to claim 1, wherein electroplating the surface of the bonding finger is performed by a gold electroplating process.

6. The method according to claim 1, wherein the first and second layers are oxide layers.

7. The method according to claim 1, wherein the bonding finger is a portion of the interconnection pattern electrically connected to a bonding pad of the chip.

* * * * *